(12) United States Patent
Kuo et al.

(10) Patent No.: US 7,271,578 B2
(45) Date of Patent: Sep. 18, 2007

(54) VOLTAGE MONITORING CIRCUIT

(75) Inventors: Hung Yi Kuo, Taipei (TW); Jenny Chen, Taipei (TW); Jiin Lai, Taipei (TW)

(73) Assignee: Via Technologies, Inc., Taipei (TW)

( * ) Notice: Subject to any disclaimer, the term of this patent is extended or adjusted under 35 U.S.C. 154(b) by 84 days.

(21) Appl. No.: 11/131,401

(22) Filed: May 18, 2005

(65) Prior Publication Data
US 2006/0232290 A1 Oct. 19, 2006

(30) Foreign Application Priority Data
Mar. 24, 2005 (TW) ............... 94109137 A

(51) Int. Cl.
*G01R 17/06* (2006.01)
(52) U.S. Cl. .................................. 324/99 D
(58) Field of Classification Search ........... 324/102, 324/99 D, 763, 765, 771, 158.1, 142; 327/77, 327/142, 143; 307/66, 87
See application file for complete search history.

(56) References Cited

U.S. PATENT DOCUMENTS 6,114,836 A * 9/2000 Hagiwara et al. ........... 320/132

6,507,183 B1 * 1/2003 Mulatti et al. ............ 324/99 D

FOREIGN PATENT DOCUMENTS

| CN | 1049058 | 2/1991 |
| CN | 1381732 | 11/2002 |

* cited by examiner

*Primary Examiner*—Ha Tran Nguyen
*Assistant Examiner*—Tung X. Nguyen
(74) *Attorney, Agent, or Firm*—Rosenberg, Klein & Lee

(57) ABSTRACT

A voltage monitoring circuit is capable of being integrated into a chip and monitoring the voltage quality. It mainly uses a first waveshaper to receive a voltage signal of a voltage source to be measured, process it to a logic signal, and output to a first logic level transformer. A first digital signal is transformed by the processing and can be recorded by a register such that a managing system can read content of the register through a bus to further determine whether the voltage source has a situation of voltage surge. Similarly, an inverter can be concatenated between a second waveshaper and a second logic level transformer to monitor whether the voltage source has undercurrent pulse. This way, an object of monitoring voltage quality in the chip with a combination of simple analog circuit can be achieved.

14 Claims, 4 Drawing Sheets

VOLTAGE MONITORING CIRCUIT

FIELD OF THE INVENTION

The present invention is related to a voltage monitoring circuit and more particularly to a circuit capable of being integrated into a chip and monitoring the voltage quality. An object of monitoring voltage quality in the chip with a combination of simple analog circuit can be achieved.

BACKGROUND

By the violent competition of electronic information industry, many electronic products raise the operating and processing speed to get the favor of consumers. However, when the operating speed of the chip in the electronic products becomes faster, the operating frequency thereof also becomes faster accordingly such that the working voltage thereof must become smaller. This way, it is caused that the sensitivity of changes of the working voltage of the chip becomes bigger accordingly. Namely, the working voltage provided to operate the chip is unstable which is sometimes a main reason causing the system crash. However, sometimes the instability of the working voltage is only an instant. Therefore, it cannot be waited to measure until the system is crash. The stability of the working voltage has to be monitored anytime and recorded such that the factor of the stability of the working voltage can be taken out of the factors of the system crash to be benefit to developers to know the reason of the system crash.

In general, a prior art voltage detecting circuit, referring FIG. 1, is mainly consisted of a comparator 11 and a zener diode 12. A first resistance 13 and a second resistance 14 are connected at a positive input of the comparator 11, and a third resistance 15 and the zener diode 12 are connected to the negative input thereof. The positive end of the zener diode 12 is connected to the other end of the second resistance 14 and grounded. Further, the output of the comparator 11 is concatenated a fourth resistance 16 and a light emitting diode 17. The positive end of the light emitting diode 17 is connected to the other end of the first resistance 13 and the third resistance 15, and also connected to a voltage source to be measured 18. This way, by the bias caused by the combination of the first resistance 13 and the second resistance 14 collocating with the operation of the comparator 11 and the zener diode 12, the user can observe whether the light emitting diode 17 radiates to determine whether the voltage source to be measured 18 has a situation of voltage surge.

While the previous voltage detecting circuit is simple, if it is desired to be integrated into a chip, usually, the light emitting diode 17 has to be set out of the case for users to visualize whether the light emitting diode 17 radiates directly to determine whether a situation of voltage surge happens. However, such a circuit design has to additionally concern the arrangement of circuit lines, and the manufacturing cost is also increased.

Besides, the light emitting diode 17 only radiates at the instant of the voltage surge happening. After the time of the voltage surge happening, the light emitting diode 17 will not radiate no more. Therefore, the user has to look out whether the light emitting diode 17 radiates anytime. If the user does not pay attention to whether the light emitting diode 17 radiates at the time of the voltage surge happening, whether a situation of unstable voltage happens previously cannot be determined. Therefore, the factor of causing the system crash by unstable voltage cannot be eliminated.

SUMMARY OF THE INVENTION

Accordingly, how to design a circuit capable of being integrated into a chip and monitoring the voltage quality thereof with respect to the previous shortcomings existed in the prior art voltage detecting circuit is the key point of the present invention. An object of monitoring voltage quality in the chip with a simple analog circuit can be achieved. Therefore, It is a primary object of the present invention to provide a voltage monitoring circuit mainly using a circuit combination of an waveshaper and a logic level transformer and directly integrating them into a single chip to achieve an object of directly monitoring working voltage quality in the chip.

It is a secondary object of the present invention to provide a voltage monitoring circuit, which uses a managing system to connect to a register through a bus to read the voltage quality record therein to be benefit to developers to know relative factors of the system crash.

It is another object of the present invention to provide a voltage monitoring circuit, which is capable of recording the digital signals outputted by a logic level transformer into a register to effectively record voltage quality in a chip to achieve an object of monitoring anytime.

To achieve the previous mentioned objects, the present invention provides a voltage monitoring circuit whose main structure comprises: at least one waveshaper, an input of each waveshaper capable of receiving a voltage signal transmitted from a voltage source to be measured which is processed to output a logic signal by an output of the waveshaper; and at least one logic level transformer, each logic level transformer capable of receiving a logic signal transmitted from the corresponding waveshaper which is transformed to output a digital signal by an output.

DETAILED DESCRIPTION

The structural features and the effects to be achieved may further be understood and appreciated by reference to the presently preferred embodiments together with the detailed description.

Figure 1:
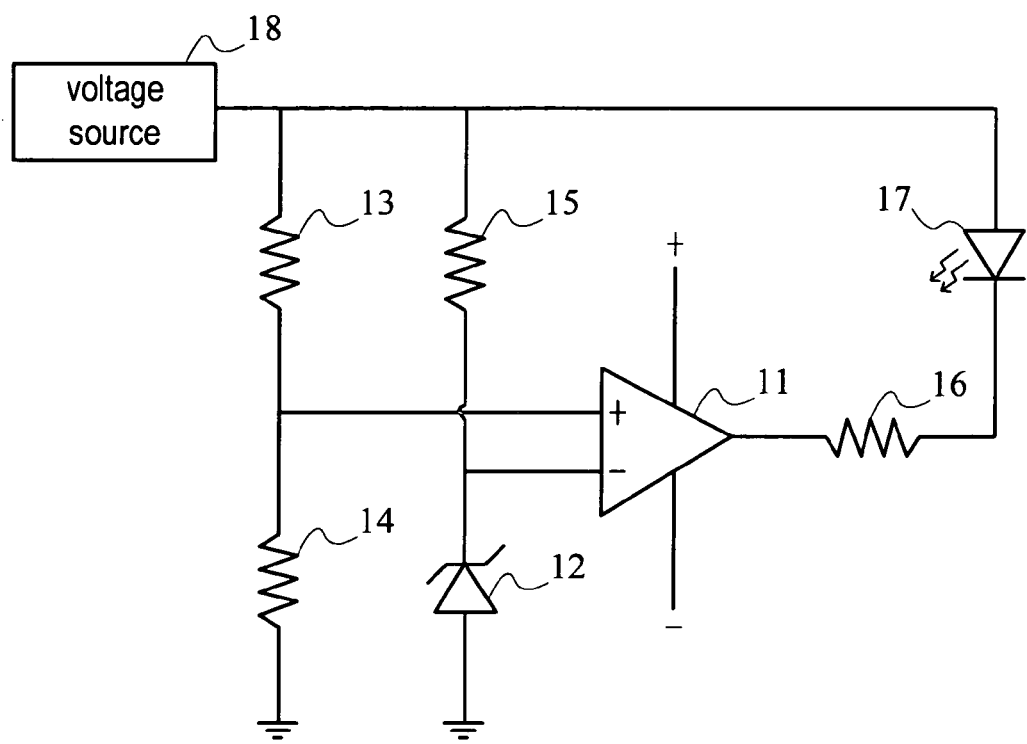
FIG. 1 is an electric connecting diagram of a prior art voltage detecting circuit.
Figure 2:
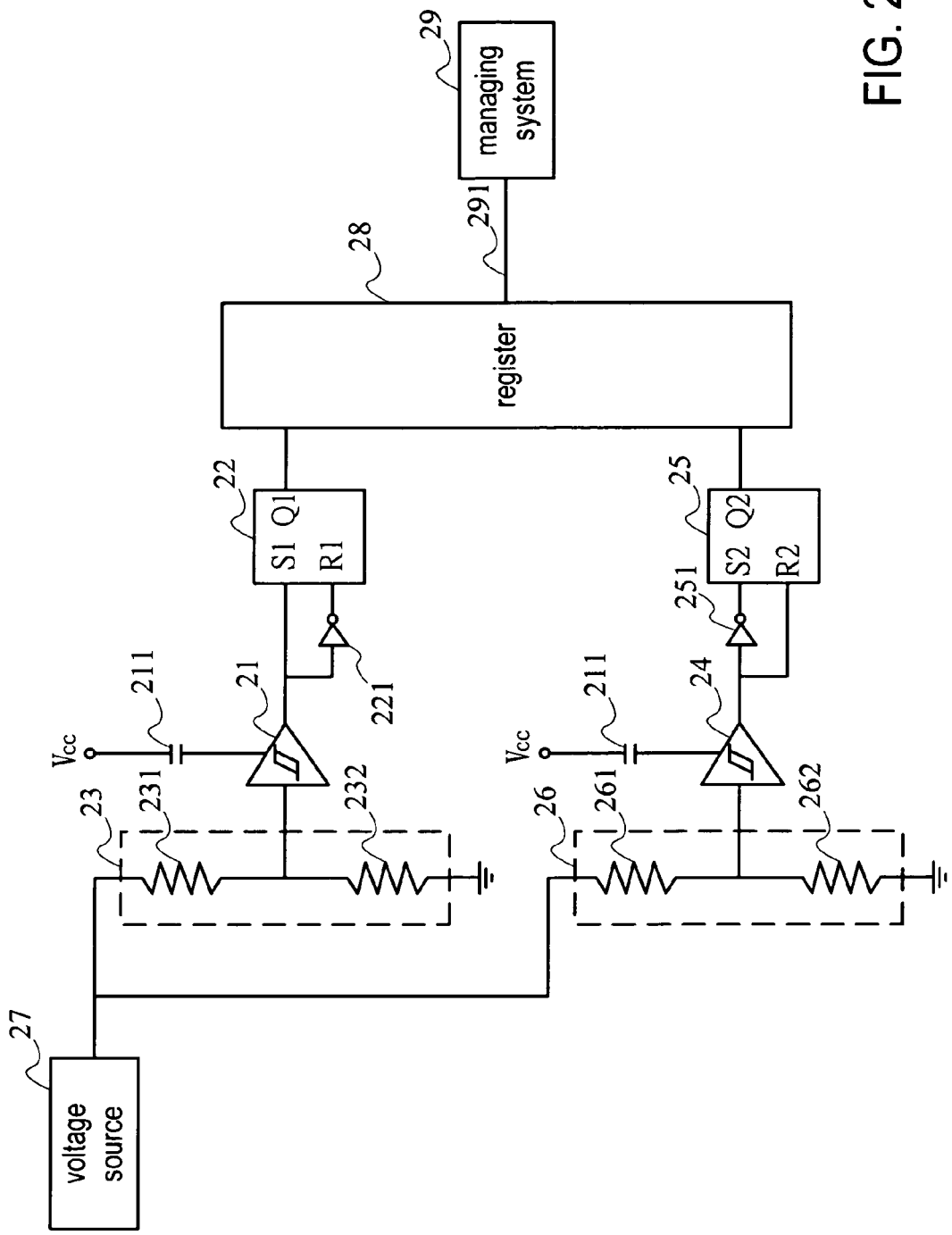
FIG. 2 is an electric connecting diagram of a preferred embodiment of the present invention.

Firstly, refer to FIG. 2, an electric connecting diagram of a preferred embodiment of the present invention. As shown, the main structure comprises a first waveshaper 21, a second waveshaper 24, a first logic level transformer 22, and a second logic level transformer 25. Wherein, the input of the first waveshaper 21 can be connected to a voltage source to be measured 27, and the output thereof can be connected to a setup end S1 set at the first logic level transformer 22. Further, the output of the first logic level transformer 22 can be connected to a register 28. The user can use a managing system 29 to connect to the register 28 through a system managing bus (SM Bus) 291 or ISA (Industry Standard Architecture) bus to access the voltage monitoring data recorded in the register 28.

The input of the second waveshaper 24 can also be connected to the voltage source to be measured 27. The output of the second waveshaper 24 is connected to an inverter 251, and then connected to the setup end S2 of the second logic level transformer 25 through the inverter 251.

The first logic level transformer 22 and the second logic level transformer 25 have respectively reset ends (R1, R2). Further, the output of the first waveshaper 21 can be connected to the reset end R1 of the first logic level transformer 22 through an inverter 221, and the reset end R2 of the second logic level transformer 25 can be directly connected to the output of the second waveshaper 24.

Furthermore, a first voltage adjusting device 23 and a second voltage adjusting device 26 can be respectively set between the voltage source to be measured 27 and each waveshaper (21, 24). That is to say, the input of the first voltage adjusting device 23 is connected to the voltage source to be measured 27, and the output thereof is connected to the input of the first waveshaper 21. The input of the second voltage adjusting device 26 is connected to the voltage source to be measured 27, and the output thereof is connected to the input of the second waveshaper 24. Wherein, the first voltage adjusting device 23 comprises a first dynamic resistance 231 and a second dynamic resistance 232. The second voltage adjusting device 26 comprises a third dynamic resistance 261 and a fourth dynamic resistance 262. Of course, the resistance value of each dynamic resistance in each voltage adjusting device (23, 26) can be properly combined to linearly adjust the voltage value of the voltage source to be measured 27 to a proper voltage level.

In the embodiment of the present invention, the first logic level transformer 22 and the second logic level transformer 25 can be respectively embodied by RS Latches. The previous first waveshaper 21 and second waveshaper 24 can be respectively embodied by Schmitt triggers.

Figure 3A:
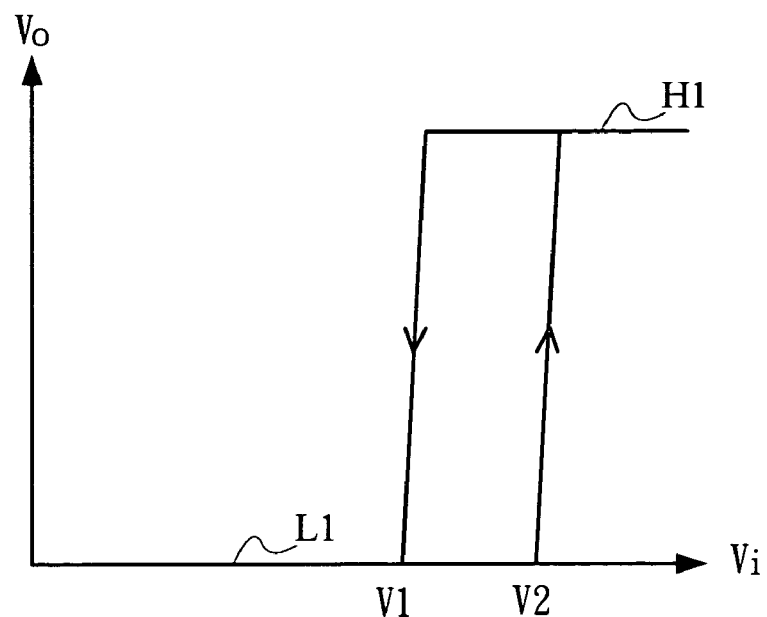
FIG. 3A and FIG. 3B are respectively electric feature diagrams of the first waveshaper and the second waveshaper of the present invention.
Figure 3B:
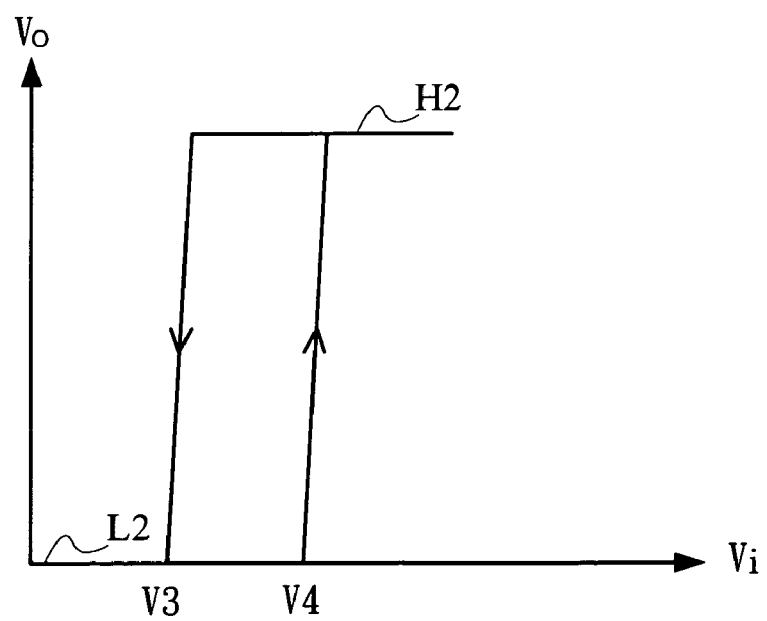

Please refer to FIG. 3A and FIG. 3B, respectively electric feature diagrams of each waveshaper 21, 24 in the embodiment shown in FIG. 2. As shown, when the input voltage Vi is higher than the toplimit voltage V2, V4 of each waveshaper 21, 24, the waveshaper 21, 24 respectively output the voltage level of high potential H1, H2. When the input voltage Vi is lower than the minimum voltage of each waveshaper 21, 24, the waveshaper 21, 24 respectively output the voltage level of low potential L1, L2.

Figure 4A:
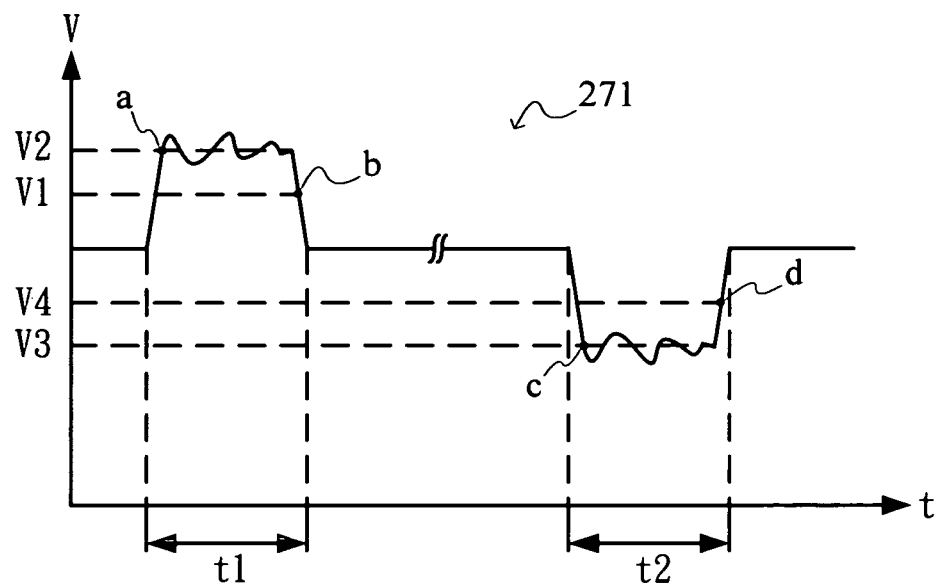
FIG. 4A to FIG. 4C are respectively timing diagrams of the voltage source to be measured and each logic level transforming device.
Figure 4B:
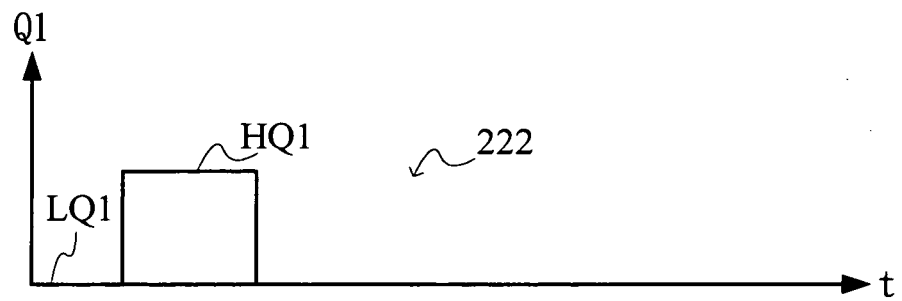
Figure 4C:
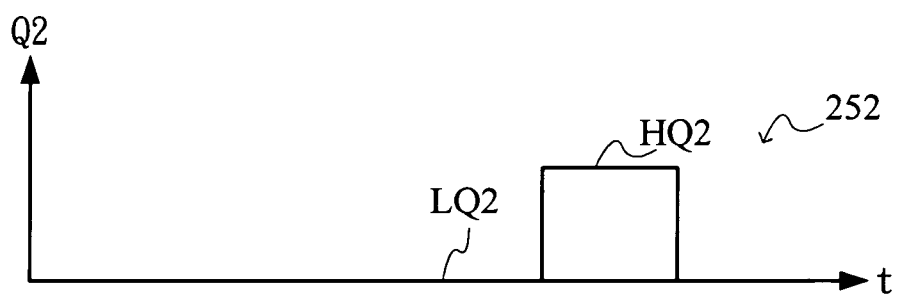

Please refer to FIG. 4A to FIG. 4C, respectively output timing diagrams of the voltage source to be measured and each logic level transforming device. Wherein, the voltage signal 271 of the voltage source to be measured 27 is as shown in FIG. 4A. When the voltage signal 271 is in the first time period t1, and there happens a voltage surge, when the voltage signal 271 raises to point a, it just crosses the toplimit voltage V2 of the first waveshaper 21 such that a voltage level of a high potential H1 is outputted. When the voltage signal 271 descends to point b, it just reaches the minimum voltage V1 of the first waveshaper 21 such that the first waveshaper 21 outputs a voltage level of a low potential L1.

When the first waveshaper 21 outputs the high potential H1 to the setup end S1 of the first logic level transformer 21, after processing and transforming, a voltage level of a high potential HQ1 is outputted by the output thereof, as shown in FIG. 4B. When the first waveshaper 21 outputs the low potential L1 and transfers to the reset end R1 of the first logic level transformer 22 after processing by the inverter 221, a voltage lever of a low potential LQ1 can be outputted. This way, the voltage surge in the voltage signal 271 can be effectively cut out, operated and processed in real time, transformed to a first digital signal 222, and recorded into the register 28. By such a creative arrangement and design of a simple circuit element, not only an object of continuously monitoring can be achieved by setting the inverter 221, but also the first digital signal 222 can be read out from the register 28 through the system managing bus 291 by the managing system 29 to further determine and monitor whether the voltage source to be measured 27 has voltage surge.

Similarly, when the voltage signal 271 has an undercurrent pulse in the second time period t2, when the voltage signal descends to point c, it can just cross the minimum voltage V3 of the second waveshaper 24 such that a voltage level of a low potential L2 is outputted. When the voltage signal 271 goes back to point d, it just reaches the toplimit voltage V4 of the second waveshaper 24 such that the second waveshaper 24 outputs a voltage level of a high potential H2.

After the second waveshaper 24 changes the voltage level of the low potential L2 through the inverter 251, it then outputs to the setup end S2 of the second logic level transformer 25, a voltage level of a high potential HQ2 by the output thereof after processing and transforming, as shown in FIG. 4C. When the second waveshaper 24 outputs high potential H2 to the reset end R2 of the second logic level transformer 25, it can be made to output a voltage level of a low potential LQ2. This way, undercurrent pulse in the voltage signal 271 can be effectively cut out, operated and processed in real time, transferred to a second digital signal 252, and recorded into the register 28. This way, the managing system 29 is used to read the second digital signal 252 out of the register 28 through the system managing bus 291 to further effectively determine and monitor whether the voltage source to be measured 27 has undercurrent pulse. This way, an object of continuously monitoring voltage quality of the voltage source to be measured can be achieved, and it is benefit to developers to know the relative factors of the systems crash.

Finally, please refer FIG. 2 again, wherein a working voltage input Vcc of the first waveshaper 21 and the second waveshaper 24 can be respectively connected to the voltage source to be measured 27. Of course, a capacitor 211 can be respectively concatenated between the voltage source to be measured 27 and the first waveshaper 21 or the second waveshaper 24. This way, the first waveshaper 21 or the second waveshaper 24 can effectively avoid voltage level from drifting to further improve the accuracy of the voltage quality monitoring effect. In addition, the first dynamic resistance 231, the second dynamic resistance 232, the third dynamic resistance 261, or the fourth dynamic resistance 262 can be respectively embodied by CMOS electronic elements. This way, the whole circuit can be integrated into a chip by existed advanced semiconductor.

The foregoing description is merely one embodiment of present invention and not considered as restrictive. All equivalent variations and modifications in process, method, feature, and spirit in accordance with the appended claims may be made without in any way from the scope of the invention.

LIST OF REFERENCE SYMBOLS 11 comparator
12 zener diode
13 first resistance
14 second resistance
15 third resistance
16 fourth resistance
17 light emitting diode
18 voltage source to be measured
21 first waveshaper
211 capacitor
22 first logic level transformer
221 inverter
222 first digital signal
23 first voltage adjusting device
231 first dynamic resistance
232 second dynamic resistance
24 second waveshaper
25 second logic level transformer
251 inverter
252 second digital signal
26 second voltage adjusting device
261 third dynamic resistance
262 fourth dynamic resistance
27 voltage source to be measured
271 voltage signal
28 register
29 managing system
291 system managing bus

What is claimed is:

1. A voltage monitoring circuit, comprising:
   at least one waveshaper, an input of each waveshaper capable of receiving a voltage signal transmitted from a voltage source to be measured which is processed to output a logic signal by an output of said waveshaper;
   at least one logic level transformer, each logic level transformer capable of receiving a logic signal transmitted from said corresponding waveshaper, transformed to output a digital signal by an output;
   a register capable of connecting with said output of each logic level transformer for recording digital signals generated by each logic level transformer; and
   a managing system which can read digital signals stored in said register through a bus.

2. The voltage monitoring circuit according to claim 1, wherein said logic level transformer has a setup end and a reset end.

3. The voltage monitoring circuit according to claim 2, wherein said output of said waveshaper is connected to said setup end.

4. The voltage monitoring circuit according to claim 3, wherein said output of said waveshaper is connected to said reset end through an inverter.

5. The voltage monitoring circuit according to claim 2, wherein said output of said waveshaper is connected to said setup end through an inverter.

6. The voltage monitoring circuit according to claim 5, wherein said output of said waveshaper is connected to said reset end.

7. The voltage monitoring circuit according to claim 1, further comprising at least one voltage adjusting device, said input of each voltage adjusting device connected to said voltage source to be measured, and said output of each voltage adjusting device connected to said input of corresponding waveshaper.

8. The voltage monitoring circuit according to claim 7, wherein said voltage adjusting device comprises a concatenated first dynamic resistance and second dynamic resistance, respectively.

9. The voltage monitoring circuit according to claim 8, wherein said first dynamic resistance and second dynamic resistance are respectively CMOS electronic elements.

10. The voltage monitoring circuit according to claim 1, wherein said waveshaper has a working voltage input connected to said voltage source for measuring.

11. The voltage monitoring circuit according to claim 10, wherein further comprises a capacitor set between said working voltage input and said voltage source for measuring.

12. The voltage monitoring circuit according to claim 1, wherein said waveshaper is a Schmitt trigger.

13. The voltage monitoring circuit according to claim 1, wherein said logic level transformer is an RS latch.

14. The voltage monitoring circuit according to claim 1, wherein said bus can be selected from a system managing bus and an ISA bus.

* * * * *